(12) United States Patent
Guo et al.

(10) Patent No.: US 10,914,567 B2
(45) Date of Patent: Feb. 9, 2021

(54) MAGNETIC SENSOR BASED PROXIMITY SENSING

(71) Applicant: Apple Inc., Cupertino, CA (US)

(72) Inventors: Jian Guo, Palo Alto, CA (US); John Greer Elias, Townsend, DE (US); Savas Gider, San Jose, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 16/279,588

(22) Filed: Feb. 19, 2019

(65) Prior Publication Data

US 2019/0265017 A1 Aug. 29, 2019

Related U.S. Application Data

(60) Provisional application No. 62/634,781, filed on Feb. 23, 2018.

(51) Int. Cl.
| | |
|---|---|
| *G01B 7/30* | (2006.01) |
| *G06F 3/01* | (2006.01) |
| *G01B 7/004* | (2006.01) |
| *G01R 33/00* | (2006.01) |
| *G06F 3/0354* | (2013.01) |

(Continued)

(52) U.S. Cl.
CPC ............ *G01B 7/30* (2013.01); *G01B 7/004* (2013.01); *G01B 7/023* (2013.01); *G01R 33/0041* (2013.01); *G01R 33/07* (2013.01); *G06F 3/014* (2013.01); *G06F 3/017* (2013.01); *G06F 3/03545* (2013.01)

(58) Field of Classification Search
CPC .......... G01B 7/30; G01B 7/004; G01B 7/023; G01R 33/0041; G01R 33/07; G06F 3/017; G06F 3/03545; G06F 3/014

USPC ................................ 324/207.22, 207.11, 200
See application file for complete search history.

(56) References Cited

U.S. PATENT DOCUMENTS

| | | |
|---|---|---|
| 5,483,261 A | 1/1996 | Yasutake |
| 5,488,204 A | 1/1996 | Mead et al. |

(Continued)

FOREIGN PATENT DOCUMENTS

| | | |
|---|---|---|
| CN | 101351764 A | 1/2009 |
| CN | 101611316 A | 12/2009 |

(Continued)

OTHER PUBLICATIONS

International Search Report dated Feb. 28, 2019, for PCT/US2018/048398, filed Aug. 28, 2018, nine pages.

(Continued)

*Primary Examiner* — Giovanni Astacio-Oquendo
(74) *Attorney, Agent, or Firm* — Kubota & Basol LLP

(57) ABSTRACT

Magnetic sensing technology can be used to detect changes, or disturbances (e.g., changes in magnetic field strength), in magnetic fields and can be used to measure the precise location/positioning of an electronic device in proximity to a magnetic source. In order to avoid interference by earth's static magnetic field, a modulated magnetic field can be used for magnetic based proximity sensing. Received modulated magnetic field signals can be demodulated to determine proximity of the sensor to the source of the modulated magnetic field. Devices such as gloves or devices with fingertip nodes based on receiving modulated magnetic fields can be used to detect user hand position.

20 Claims, 9 Drawing Sheets

(51) Int. Cl.
G01B 7/02 (2006.01)
G01R 33/07 (2006.01)

(56) References Cited

U.S. PATENT DOCUMENTS

| | | | |
|---|---|---|---|
| 5,790,191 A * | 8/1998 | Zhang | H04N 5/3658 |
| | | | 348/300 |
| 5,825,352 A | 10/1998 | Bisset et al. | |
| 5,835,079 A | 11/1998 | Shieh | |
| 5,880,411 A | 3/1999 | Gillespie et al. | |
| 6,188,391 B1 | 2/2001 | Seely et al. | |
| 6,310,610 B1 | 10/2001 | Beaton et al. | |
| 6,323,846 B1 | 11/2001 | Westerman et al. | |
| 6,690,387 B2 | 2/2004 | Zimmerman et al. | |
| 7,015,894 B2 | 3/2006 | Morohoshi | |
| 7,184,064 B2 | 2/2007 | Zimmerman et al. | |
| 7,663,607 B2 | 2/2010 | Hotelling et al. | |
| 8,427,558 B2 * | 4/2013 | Inui | H01L 27/14643 |
| | | | 348/241 |
| 8,462,240 B2 * | 6/2013 | Osawa | H04N 5/341 |
| | | | 348/294 |
| 8,479,122 B2 | 7/2013 | Hotelling et al. | |
| 9,665,174 B2 | 5/2017 | Osman | |
| 2006/0115348 A1 | 6/2006 | Kramer | |
| 2006/0197753 A1 | 9/2006 | Hotelling | |
| 2007/0063992 A1 | 3/2007 | Lundquist | |
| 2014/0198035 A1* | 7/2014 | Bailey | G06F 3/011 |
| | | | 345/156 |
| 2014/0215684 A1 | 8/2014 | Hardy | |
| 2015/0358543 A1 | 12/2015 | Kord | |
| 2016/0187973 A1 | 6/2016 | Shankar et al. | |
| 2016/0187974 A1 | 6/2016 | Mallinson | |
| 2016/0246370 A1 | 8/2016 | Osman | |
| 2016/0313798 A1 | 10/2016 | Connor | |
| 2016/0338644 A1 | 11/2016 | Connor | |
| 2017/0090568 A1 | 3/2017 | Chen et al. | |
| 2017/0212589 A1 | 7/2017 | Domenikos | |
| 2017/0228095 A1 | 8/2017 | Domaradzki et al. | |
| 2017/0262060 A1 | 9/2017 | Katsuki et al. | |
| 2017/0316765 A1 | 11/2017 | Louhivuori et al. | |
| 2018/0074593 A1 | 3/2018 | Dibbur | |
| 2019/0021924 A1 | 1/2019 | Trepanier et al. | |
| 2019/0101981 A1 | 4/2019 | Elias | |
| 2020/0112646 A1* | 4/2020 | Tanaka | G06F 1/3215 |
| 2020/0142490 A1* | 5/2020 | Xiong | G06F 3/014 |

FOREIGN PATENT DOCUMENTS

| | | |
|---|---|---|
| CN | 102188246 A | 9/2011 |
| CN | 103718057 A | 4/2014 |
| CN | 104281261 A | 1/2015 |
| CN | 105353866 A | 2/2016 |
| CN | 205540575 U | 8/2016 |
| CN | 106174813 A | 12/2016 |
| CN | 206248100 U | 6/2017 |
| CN | 107533369 A | 1/2018 |
| EP | 3208687 A1 | 8/2017 |
| JP | 2000163031 | 6/2000 |
| JP | 2002342033 | 11/2002 |
| RU | 179301 U | 5/2018 |
| WO | WO2016097841 A2 | 6/2016 |
| WO | 2019067144 A1 | 4/2019 |

OTHER PUBLICATIONS

Connolly, J. et al. (Feb. 1, 2018). "IMU Sensor-Based Electronic Goniometric Glove for Clinical Finger Movement Analysis," IEEE Sensor Journal, vol. 18, No. 3, nine pages.

Lee, S.K. et al. (Apr. 1985). "A Multi-Touch Three Dimensional Touch-Sensitive Tablet," Proceedings of CHI: ACM Conference on Human Factors in Computing Systems, pp. 21-25.

Rubine, D.H. (Dec. 1991). "The Automatic Recognition of Gestures," CMU-CS-91-202, Submitted in Partial Fulfillment of the Requirements for the Degree of Doctor of Philosophy in Computer Science at Carnegie Mellon University, 285 pages.

Rubine, D.H. (May 1992). "Combining Gestures and Direct Manipulation," CHI '92, pp. 659-660.

Westerman, W. (Spring 1999). "Hand Tracking, Finger Identification, and Chordic Manipulation on a Multi-Touch Surface," A Dissertation Submitted to the Faculty of the University of Delaware in Partial Fulfillment of the Requirements for the Degree of Doctor of Philosophy in Electrical Engineering, 364 pages.

Notice of Allowance received for U.S. Appl. No. 16/115,367, dated Sep. 4, 2020, 11 pages.

Utility Model Patentability Evaluation Report received for Chinese Utility Model Patent No. ZL201920223460.9, mailed on May 7, 2020, 6 pages. (3 pages of English Translation and 3 pages of Official Copy).

Office Action received for Chinese Patent Application No. 201921033589.X, dated Apr. 26, 2020, 7 pages.

International Search Report and Written Opinion received for PCT Patent Application No. PCT/US2018/048398, dated Feb. 28, 2019, 22 pages.

International Search Report and Written Opinion received for PCT Patent Application No. PCT/US2019/019041, dated May 22, 2019, 12 pages.

Office Action received for Chinese Patent Application No. 201921033589.X, dated Dec. 9, 2019, 4 pages (2 pages of English Translation and 2 pages of Official Copy).

Restriction Requirement received for U.S. Appl. No. 16/115,367, dated Nov. 13, 2019, 5 pages.

Utility Model Patentability Evaluation Report received for Chinese Patent Application No. 201821431418.8, mailed on Aug. 27, 2019, 14 pages (8 pages of English translation and 6 pages of Official copy).

Non-Final Office Action received for U.S. Appl. No. 16/115,367, dated Apr. 7, 2020, 19 pages.

* cited by examiner

MAGNETIC SENSOR BASED PROXIMITY SENSING

CROSS-REFERENCE TO RELATED APPLICATIONS

This application claims the benefit of U.S. Provisional Patent Application No. 62/634,781, filed Feb. 23, 2018, the disclosure of which is incorporated herein.

FIELD OF THE DISCLOSURE

This relates generally to magnetic sensor based proximity sensing and devices, systems, and methods for operation thereof. More particularly, this disclosure relates to a magnetic sensor based proximity sensing that is capable of measuring the movement of individual finger and thumb bones.

BACKGROUND OF THE DISCLOSURE

Magnetic sensing technology can be used to detect changes, or disturbances (e.g., changes in magnetic field strength), in magnetic fields and can be used to measure the precise location/positioning of an electronic device in proximity to a magnetic source. In order to avoid interference by earth's static magnetic field, a modulated magnetic field can be used for magnetic based proximity sensing. Received modulated magnetic field signals can be demodulated to determine proximity of the sensor to the source of the modulated magnetic field.

SUMMARY OF THE DISCLOSURE

This disclosure relates to a magnetic sensor based proximity sensing architecture that enables precise location/positioning of electronic devices (e.g. smartphone, tablet, other handset or wearable devices) in proximity to a modulated magnetic source.

More specifically, it relates to a magnetic sensor based proximity sensing architecture. A differential voltage source pair modulated at a frequency can generate a corresponding modulation current. An electromagnetic coil (e.g., spiral, cylindrical, or circular) can get excited by the modulation current and generate a magnetic field B (T) that has the same modulation simulation. The magnetic sensor receives the modulated magnetic field and performs demodulation. The distance d between the magnetic sensor and the electromagnetic coil can be determined based on magnetic field amplitude after demodulation. Multiple magnetic sensors aligned to detect magnetic field changes in different field directions axes can also be used to determine the three-dimensional position of the magnetic field and can provide more information in locating the fingers and the hands.

One exemplary application of the magnetic sensor based proximity sensing architecture is a device with fingertip nodes that can include a plurality of magnetic sensors to track the movement of one or more finger and/or hand sections. By placing a magnetic sensor on each fingertip, for example, inverse kinematics can be applied to compute the orientation, position, and angle of objects (e.g., finger bones) using proximity signals detected by the magnetic sensors.

The control device with fingertip nodes can also include one or more other electronic components, such as a plurality of electrodes for sensing the heading, enabling capacitive touch, and/or contact sensing between finger tips. The control device with fingertip nodes can also include force sensors, actuators for haptic feedback, temperature sensors, and heaters. The control device with fingertip nodes can further include logic such as an on-board controller, a connector, a transceiver, a battery, and the like. The control device with fingertip nodes can also include a host controller that renders the profile of the hand on the screen. Signals from the fingertip nodes can be carried to the host controllers using wireless technology.

BRIEF DESCRIPTION OF THE DRAWINGS

For a better understanding of the various described examples, reference should be made to the Detailed Description below, in conjunction with the following drawings in which like reference numerals refer to corresponding parts throughout the figures.

DETAILED DESCRIPTION

Figure 1:
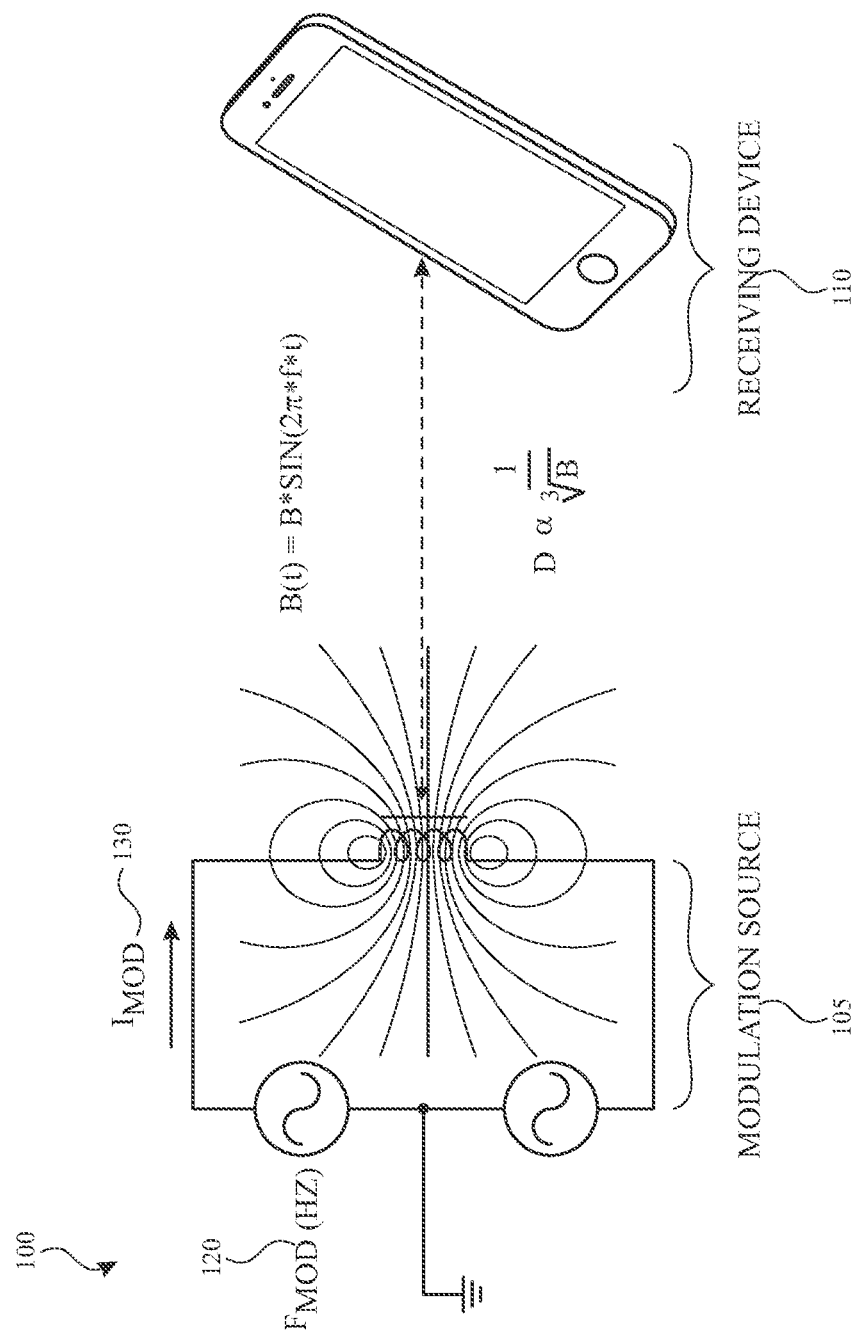
FIG. 1 illustrates an exemplary architecture based on magnetic sensor based proximity sensing according to examples of the disclosure.

In the following description of examples, reference is made to the accompanying drawings which form a part hereof, and in which it is shown by way of illustration specific examples that can be optionally practiced. It is to be understood that other examples can be used and structural changes can be made without departing from the scope of the disclosed examples.

Various techniques and process flow steps will be described in detail with reference to examples as illustrated in the accompanying drawings. In the following description, numerous specific details are set forth in order to provide a thorough understanding of one or more aspects and/or features described or referenced herein. It will be apparent, however, to one skilled in the art, that one or more aspects and/or features described or referenced herein may be practiced without some or all of these specific details. In other instances, well-known process steps and/or structures have not been described in detail in order to not obscure some of the aspects and/or features described or referenced herein.

Further, although process steps or method steps can be described in a sequential order, such processes and methods can be configured to work in any suitable order. In other words, any sequence or order of steps that can be described in the disclosure does not, in and of itself, indicate a requirement that the steps be performed in that order. Further, some steps may be performed simultaneously despite being described or implied as occurring non-simultaneously (e.g., because one-step is described after the other step). Moreover, the illustration of a process by its depiction in a drawing does not imply that the illustrated process is exclusive of other variations and modification thereto, does not imply that the illustrated process or any of its steps are necessary to one or more of the examples, and does not imply that the illustrated process is preferred.

Magnetic sensing technology can be used to detect changes, or disturbances (e.g., changes in magnetic field strength), in magnetic fields and can be used to measure the precise location/positioning of an electronic device in proximity to a magnetic source. In order to avoid interference by earth's static magnetic field, a modulated magnetic field can be used for magnetic based proximity sensing. Received modulated magnetic field signals can be demodulated to determine sensor proximity to the source of the modulated magnetic field.

This disclosure relates to a new magnetic sensor based proximity sensing architecture that enables precise location/positioning of electronic devices (e.g. smartphone, tablet, other handset or wearable devices) in proximity to a modulated magnetic source.

More specifically, it relates to a device with fingertip nodes based on a magnetic sensor based proximity sensing architecture that is capable of measuring the movement of individual finger and thumb bones. The device with fingertip nodes can include a plurality of magnetic sensors to track the movement of one or more finger and/or hand sections. A differential voltage source pair modulated at a frequency can generate a corresponding modulation current. An electromagnetic coil (e.g., spiral, cylindrical, or circular) can get excited by the modulation current and generate a magnetic field B(t) that has the same modulation simulation. The magnetic sensor receives the modulated magnetic field and performs demodulation. The distance d between the magnetic sensor and electromagnetic coil can be determined based on magnetic field amplitude after demodulation. In some examples, a magnetic sensor arrangement that is capable of detecting both distance and direction can be utilized to obtain additional information about the positioning of a fingertip node. For example, a magnetic sensor arrangement can be configured to detect magnetic field components for multiple directions (e.g., x, y, and z components), and the multiple field components can be used to determine a three-dimensional position of the fingertip node. In some examples, the multiple components can be obtained by including multiple magnetic sensors oriented to be sensitive to magnetic field variation in orthogonal directions. In some examples, a three-axis sensor can be used to determine the direction of the magnetic field as well as the distance. Inverse kinematics can be applied to compute the orientation, position, and angle of objects (e.g., finger bones) that the magnetic sensor can be attached.

A magnetic sensor can be located proximate to a fingertip (or thumbtip) and can measure the orientation, position, and angle of all the bones in that finger (or thumb). The device with fingertip nodes can also include one or more other electronic components, such as a plurality of electrodes for sensing heading, enabling capacitive touch, and/or contact sensing between finger tips. The device with fingertip nodes can also include force sensors, actuators for haptic feedback, temperature sensors, and heaters. The device with fingertip nodes can further include logic such as an on-board controller, a connector, a transceiver, a battery, and the like. The device with fingertip nodes can also include a host controller that renders the profile of the hand on the screen. Signals from the fingertip nodes can be carried to the host controllers (e.g., a remote computer and/or a wearable portable device, etc.) using wireless technology.

Representative applications of methods and apparatus according to the present disclosure are described in this section. These examples are being provided solely to add context and aid in the understanding of the described examples. It will thus be apparent to one skilled in the art that the described examples may be practiced without some or all of the specific details. In other instances, well-known process steps have been described in detail in order to avoid unnecessarily obscuring the described examples. Other applications are possible, such that the following examples should not be taken as limiting.

FIG. 1 illustrates an exemplary architecture of magnetic sensor based proximity sensing according to examples of the disclosure. The magnetic sensor based proximity sensing architecture 100 can include a modulation source 105 and a receiving device 110. In some examples, a differential modulation voltage source pair (120A, 120B) can be modulated at a single tone frequency ($f_{mod}$) can generate a corresponding modulation current $I_{mod}$ 130. In some examples, an electromagnetic coil (e.g., spiral, cylindrical, or circular) excited by the modulation current can generate a modulated magnetic field B(t). In some examples, a receiving device 110 can receive the modulated magnetic field (e.g., at a corresponding coil) and perform demodulation on the current induced in the coil by the magnetic field. The distance d between electronic device and coil can be determined based on the magnetic field amplitude after demodulation is approximately proportional to the inverse of the cube root of magnetic field strength. In some examples, a magnetic sensor arrangement that is capable of detecting both distance and direction can be utilized to obtain additional information about the positioning of a fingertip node. For example, a magnetic sensor arrangement can be configured to detect magnetic field components for multiple directions (e.g., x, y, and z components), and the multiple field components can be used to determine a three-dimensional position of the fingertip node. In some examples, the multiple components can be obtained by including multiple magnetic sensors oriented to be sensitive to magnetic field variation in orthogonal directions. In some examples, a three-axis sensor can be used to determine the direction of the magnetic field as well as the distance.

By using a modulated magnetic field from the modulation source 105, a magnetic sensing configuration that rejects the effects of magnetic interferences such permanent magnets, Earth's magnetic field, and DC power sources, etc. can be realized. In some examples, the use of a modulated magnetic field may also offer improved stability against environmental interferences as the magnetic field measurement can be locked at a specific operation frequency which provides the opportunity to filter unwanted AC interferences from other frequency bands. In some examples, the use of a modulated magnetic field may also offer improved stability over long term drift, e.g., magnetic sensor offset drift and coil magnetic field drift due to thermal heating. For example, to the extent that the effects of magnetic sensor direct and coil magnetic drift manifest as a DC offset at the output of a magnetic sensor, the DC offset component can be filtered out after demodulation. Exemplary applications of modulated magnetic field based proximity sensing will be discussed in more detail in connection with the figures below.

Figure 2:
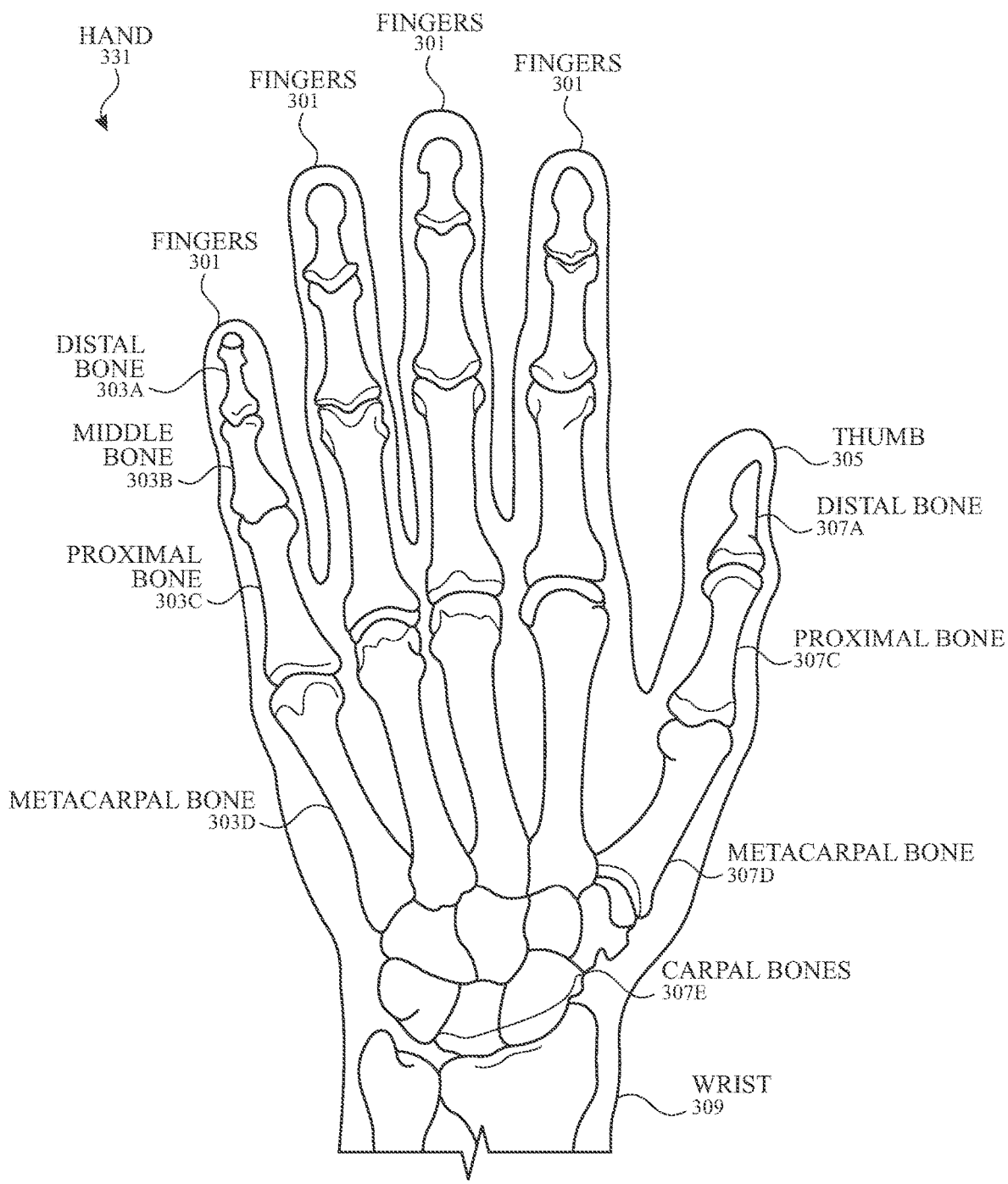
FIG. 2 illustrates an exemplary model of a human hand according to examples of the disclosure.

FIG. 2 illustrates an exemplary model of a human hand according to examples of the disclosure. The human hand 331 can have 27 degrees of freedom. Each of the four fingers 301 can have four degrees of freedom due to joints located between the distal bone 303A, the middle bone 303B, and the proximal bone 303C that can allow for flexion or extension. Each of the four fingers 301 also has a joint associated with the metacarpal bone 303D that can allow for abduction or adduction. The thumb 305 can have five degrees of freedom due to a joint located between the distal bone 307A and the proximal bone 307C that can allow for flexion or extension. A joint located between the proximal bone 307C and the metacarpal bone 307D on the thumb 305 can allow for flexion (or extension) and abduction (or adduction). Additionally, a joint located between the metacarpal bone 307D on the thumb 305 and the carpal bones 307E can allow for flexion (or extension) and abduction (or adduction). Furthermore, the wrist 309 can have six degrees of freedom, where the user's wrist movement can include flexion or extension, abduction or adduction, and supination or pronation. A magnetic sensor capable of tracking the hand's multiple degrees of freedom may be desirable.

Overview of a Control Device with Fingertip Nodes

Figure 3:
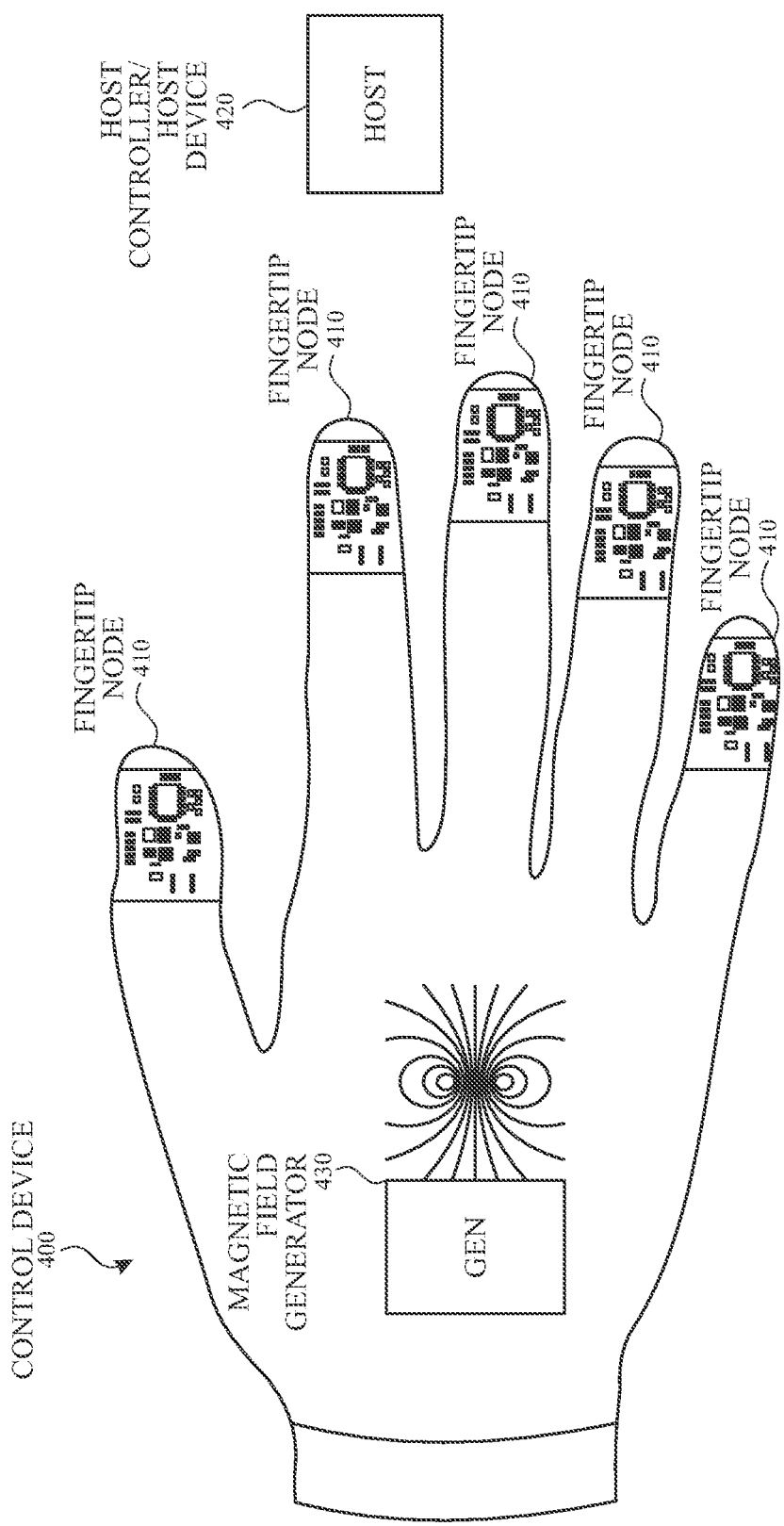
FIG. 3 illustrates a front view of an exemplary control device with fingertip nodes according to examples of the disclosure.

FIG. 3 illustrates a front view of an exemplary control device 400 with fingertip nodes 410 according to examples of the disclosure. In some examples, one fingertip node 410 can be slipped on to each of a user's fingertips. In some examples, a magnetic field generator 430 can be located proximate to the user's palm in a location that is stationary relative to the movement of bones in the user's fingers and hands. Although FIG. 3 illustrates the magnetic field generator 430 located proximate to the palm of the user's hand, in some examples, the magnetic field generator can be located proximate to the user's wrist, the back of the user's hand, or other locations. In some examples, the magnetic field generator 430 can be included in a wearable accessory (e.g., a watch or bracelet). In some examples, the magnetic field generator 430 can be included as a component in a hand controller (not shown) that can include other electronic components such as a wireless transceiver, a magnetic sensor, a controller, buses, one or more LEDs, and a battery. In some examples, each fingertip node 410 can include a plurality of electronic components, where some or all of the electronic components can be knitted, woven or embedded into the material of the fingertip node 410. The electronic components can include one or more of magnetic sensors, demodulators, filter and ADC, a controller, buses, one or more LEDs, a battery and a wireless transceiver. The fingertip node 410 can be configured to capture the motion of the user's fingers. The plurality of magnetic sensors can be configured to track the movement of one or more of the user's fingertips. The controller can include logic configured to communicate with the electronic components via the plurality of buses. The LED(s) can be configured to provide optical feedback to the user. The battery can be configured to provide power to the electronic components. The wireless transceiver can be configured to communicate with an external device (e.g., the headset, the hand controller, and/or the host device illustrated in FIG. 1).

In some examples, each fingertip node 410 can include one or more magnetic sensors to track the movement of each of a user's fingers. In some examples, an electromagnetic coil (e.g., spiral, cylindrical, or circular) can get excited by a modulated current (e.g., from the magnetic field generator 430) and generate a magnetic field B(t) that has the same modulated characteristic. The magnetic sensor can receive the modulated magnetic field and perform demodulation. The distance "d" between the magnetic sensor and coil can be determined based on magnetic field amplitude after demodulation. In some examples, the distance can be measured as a three dimensional position (e.g., x, y, z coordinates). In some examples, a magnetic sensor arrangement that is capable of detecting both distance and direction can be utilized to obtain additional information about the positioning of a fingertip node. For example, a magnetic sensor arrangement can be configured to detect magnetic field components for multiple directions (e.g., x, y, and z components), and the multiple field components can be used to determine a three-dimensional position of the fingertip node. In some examples, the multiple components can be obtained by including multiple magnetic sensors oriented to be sensitive to magnetic field variation in orthogonal directions. In some examples, a three-axis sensor can be used to determine the direction of the magnetic field as well as the distance. Using information from multiple fingertip nodes 410 on different fingers, inverse kinematics can be applied to compute the orientation, position, and angle of finger and hand bones. In some examples, the host device 420 can perform the inverse kinematic computations and render the image of the fingers. In some examples, the inverse kinematics computation can be carried out in a hand controller (not shown) that includes the magnetic field generator 430 as well as a processor or other computational circuitry. In some examples, each fingertip sensor can be assigned an identifier that is communicated with the host (not shown) or the hand controller (not shown) to distinguish between which finger a particular position data point corresponds to. In some example, the finger identification can be assumed according to typical biomechanical relationship of the bones in the human hand. In some examples, movement of each finger resolve any ambiguity in which node is attached to which fingertip (e.g., when it is initially unclear whether the hand is facing palm up or palm down).

Electronic Structure of the Device with Fingertip Nodes or Magnetic Sensors

Figure 4A:
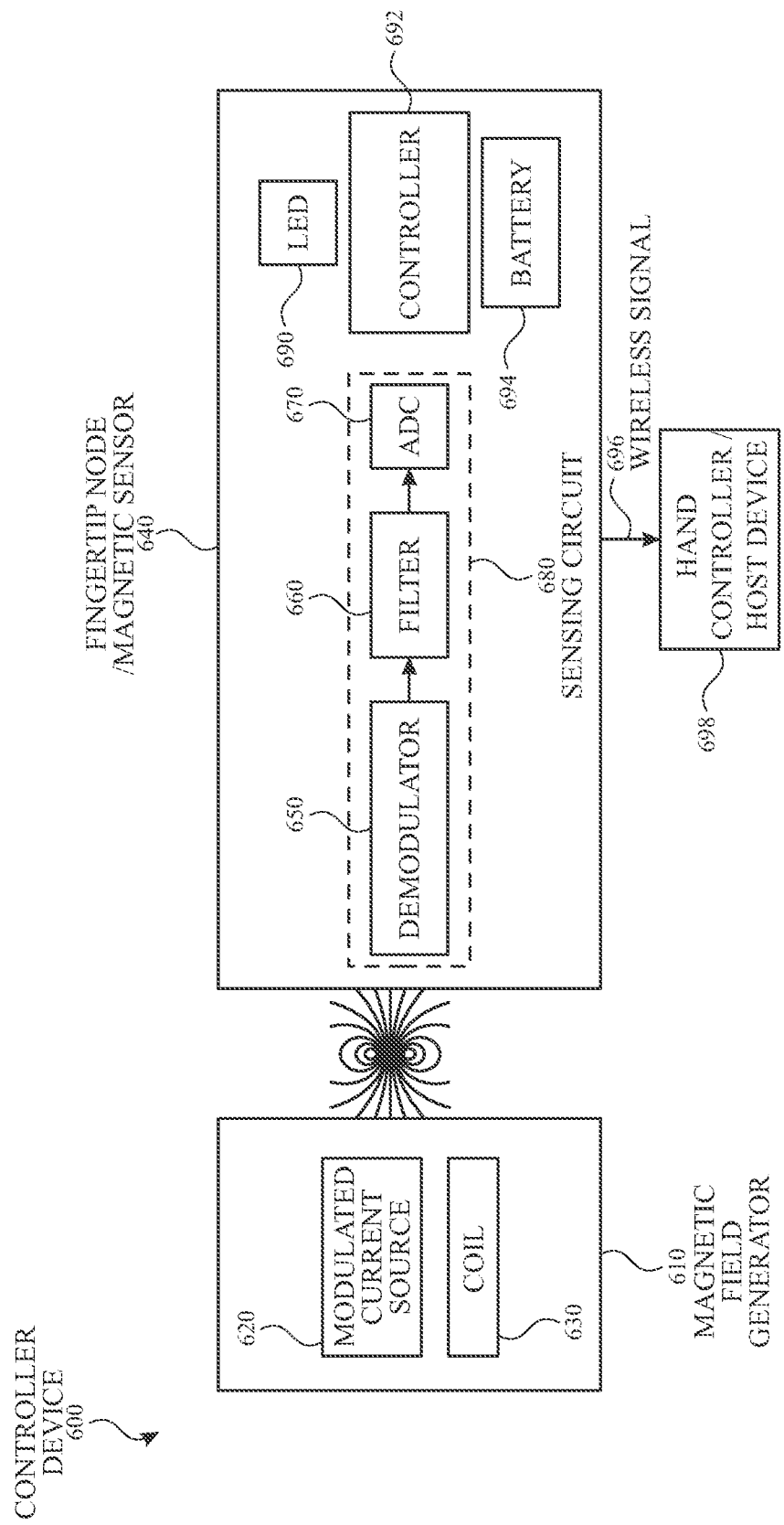
FIG. 4A illustrates a block diagram of an exemplary control device with fingertip nodes or magnetic sensors on the hands according to examples of the disclosure.

FIG. 4A illustrates a block diagram of an exemplary device 600 with fingertip nodes or magnetic sensors on the hands according to examples of the disclosure.

The device with fingertip nodes or magnetic sensors can include one or more of a plurality of magnetic sensors 640, a modulated current source 620, one or more electromagnetic coils 630, a host device 698, demodulators 650, filter 660 and ADC 670, a controller 692, a plurality of buses, one or more LEDs 690, a battery 694 and a wireless transceiver 692. The modulated current source 620 modulated at a frequency can generate a corresponding modulation current. In some examples, the electromagnetic coil (e.g., spiral, cylindrical, or circular) 630 can get excited by the modulation current and generate a magnetic field B(t) that has the same modulation simulation. In general, the modulation pattern can be sinusoidal. In some examples, there can be only one electromagnetic coil for both the hands and all the fingers. Alternatively, in other examples, there can be separate electromagnetic coils, one for each hand and one each for all the fingers of each hand. The electromagnetic coil for the fingertips can require small magnetic fields to track the fingertips as opposed to the electromagnetic coil for the hands which can require stronger magnetic fields to track the hands (e.g., due to the greatest distance between the hand magnetic sensors and the magnetic field source). Having separate electromagnetic coils can also provide better resolution of the field and better directional identification for tracking the fingertips. The electromagnetic coil 630 can also be configured with different frequencies for tracking different fingers. Alternatively, the electromagnetic coil 630 can be configured with different frequencies for tracking the right and the left hands. Alternatively, the electromagnetic coil 630 can have a first frequency for tracking all the fingers of the right hand, a second frequency for tracking all the fingers of the left hand and a third frequency for tracking both the right and the left hands.

In some examples, there can be multiple electromagnetic coils for tracking the fingers of one hand, for example, the right hand. The multiple electromagnetic coils can improve the spatial resolution for tracking the fingers. The multiple electromagnetic coils can be driven at different frequencies and can be separated in space (e.g., located at different positions on the hand). The further the electromagnetic coils are separated, the better the resolution of position detection can be. The magnetic sensors 640 receive the modulated magnetic field and perform demodulation. A demodulator 650 operating at the same frequency (f) as the incoming magnetic field can perform demodulation and convert the magnetic field into a voltage output. Furthermore, when multiple electromagnetic coils are used, relative strength of magnetic fields contributions from the different coils can be used to find the position of the fingertips.

In some examples, after demodulation, the low-pass filter 660 can remove high frequency components (f & 2f). This can eliminate any low frequency magnetic interferences ($B_0$) that the sensor can see from the environment. After filtering, the output voltage can be proportional to the strength of the magnetic field at the modulation frequency. In some examples, an ADC 670 can convert the filtered signal into digital outputs for post-processing. During post processing, the distance "d" between the magnetic sensors and the coil can be determined based on magnetic field amplitude. In some examples, a magnetic sensor arrangement that is capable of detecting both distance and direction can be utilized to obtain additional information about the positioning of a fingertip node. For example, a magnetic sensor arrangement can be configured to detect magnetic field components for multiple directions (e.g., x, y, and z components), and the multiple field components can be used to determine a three-dimensional position of the fingertip node. In some examples, the multiple components can be obtained by including multiple magnetic sensors oriented to be sensitive to magnetic field variation in orthogonal directions. In some examples, a three-axis sensor can be used to determine the direction of the magnetic field as well as the distance. In some examples, the position of each fingertip can be computed with respect to the back of the hand that the finger corresponds to. A computation of inverse kinematics can be carried out in a hand controller (not shown) or the host device 698. The host device 698 can use the orientation, position, and angle of objects (e.g., finger and hand bones) from the inverse kinematics calculations to then render the hands and the fingers with the accurate joint positions.

Figure 4B:
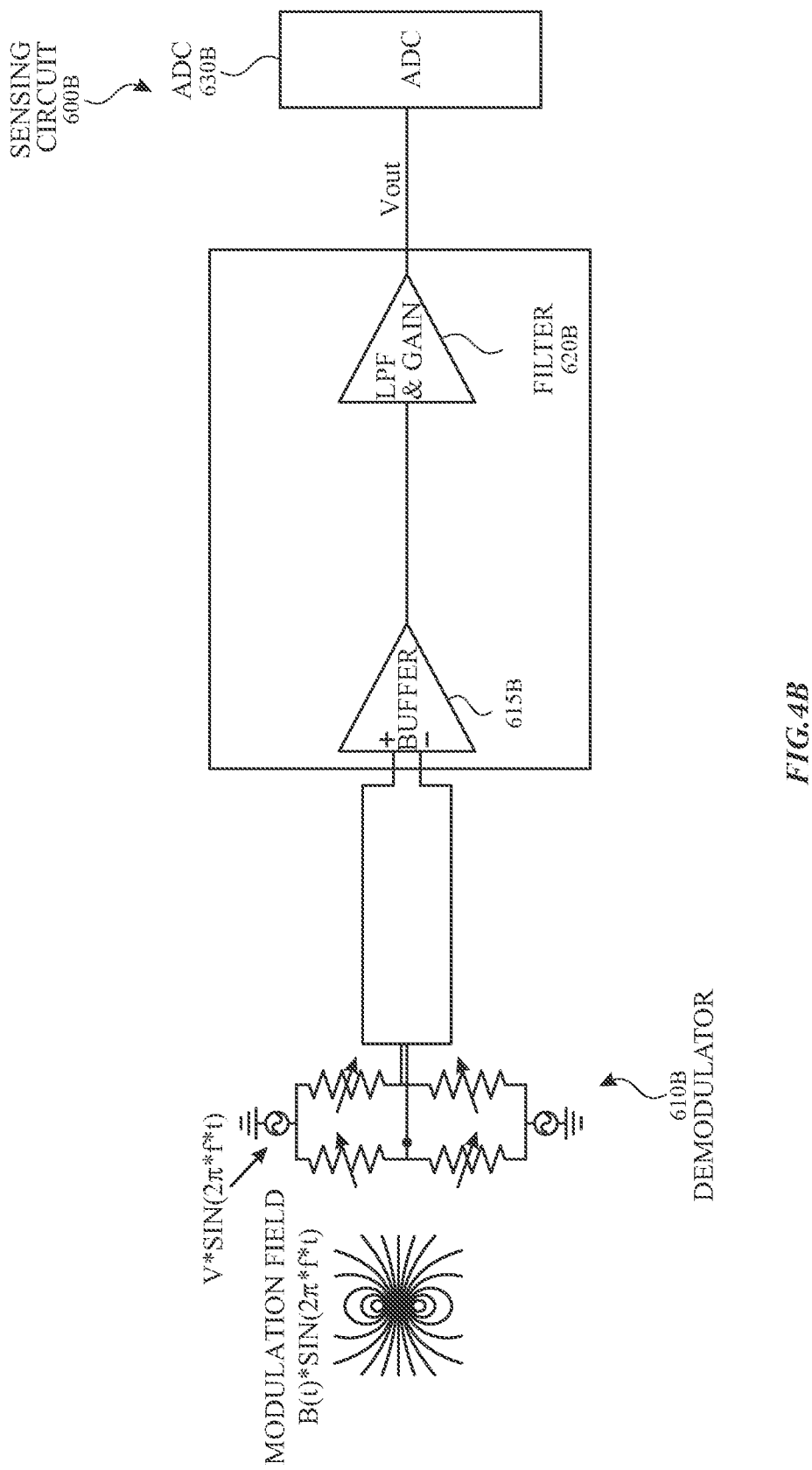
FIG. 4B illustrates an electrical diagram of an exemplary magnetic sensing circuit according to examples of the disclosure.

FIG. 4B illustrates a partial electrical diagram of an exemplary magnetic sensing circuit 600B according to examples of the disclosure. The magnetic sensing circuit 600B can receive a modulated magnetic field and perform demodulation at demodulator 610. In some examples, the demodulator 610 can be a Wheatstone bridge modulated at the same frequency (f) as the incoming magnetic field and can convert the magnetic field into voltage output. Accordingly, because the demodulation occurs before digitization, the example of FIG. 4B can be considered an analog demodulation scheme. It should be understood by those of ordinary skill in the art that other circuit architectures for performing analog domain modulation can be used without departing from the scope of the present disclosure. After demodulation, the differential output of the Wheatstone bridge can be buffered at buffer 615B and the buffered signal can be passed through the low-pass filter 620B to remove high frequency components (e.g., at frequencies f & 2*f). This filtering can eliminate any low frequency magnetic interferences ($B_0$) that the magnetic sensor can see from the environment. In some examples, an ADC 630B can convert the filtered signal Vout into digital outputs for post-processing.

Figure 4C:
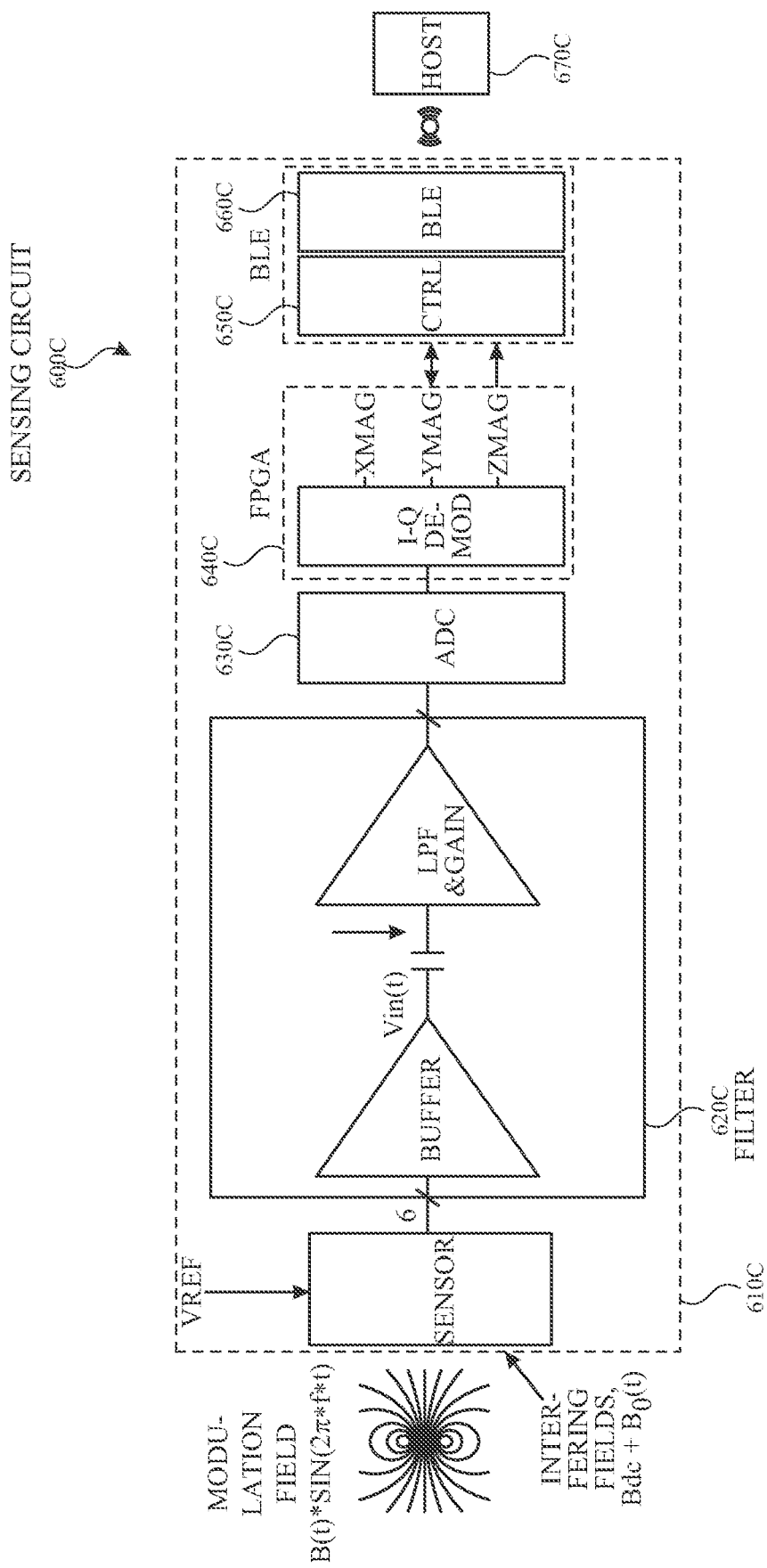
FIG. 4C illustrates an electrical diagram of another exemplary magnetic sensing circuit according to examples of the disclosure.

FIG. 4C illustrates an electrical diagram of an exemplary sensing circuit 600C according to examples of the disclosure. The sensing circuit 600C can represent one of the fingertip nodes or magnetic sensors described in FIG. 3 above. In some examples, an externally located magnetic field generator (e.g., worn on the hand, head, or neck of a user) can generate a modulated magnetic field B(t). In some examples, the modulation pattern of the magnetic field can be sinusoidal. In some examples, a magnetic sensor 610C can receive the modulated magnetic field. In some examples, DC magnetic fields and/or Earth's magnetic field can be filtered out by the filter 620C. An ADC 630C can convert the filtered signal into digital outputs. In some examples, I-Q demodulator 640C can perform in phase and quadrature phase demodulation on the digital outputs to generate a distance "d" between the magnetic field generator and magnetic sensor. In some examples, I-Q demodulator 640C can perform in phase and quadrature phase demodulation on the digital outputs to generate the x, y, and z the position of the fingers or the hands (e.g., Xmag, Ymag, and Zmag), as described in the examples above. In some examples, during the I-Q demodulation, both the in phase and quadrature phase components can be read at the same time. In some examples, a controller 650C can receive the position data and coordinate communication of the data over a wireless communication link. In some examples, the position of each fingertip can be computed with respect to the back of the hand that the finger corresponds to. In some examples, a Bluetooth low energy (BLE) radio 660C can transmit the position of the fingertips and the hand to the host device 670C. In some examples, inverse kinematics computation can be carried out in the host device 670C. In some examples, the inverse kinematics computation can be performed at an intermediate processor such as a hand controller (not shown). In some examples, the host device 670C can then use the results of the inverse kinematics calculation to render the hands and the fingers with the accurate joint positions in the environment.

Operation of the Device with Fingertip Nodes and/or Magnetic Sensors

Figure 5:
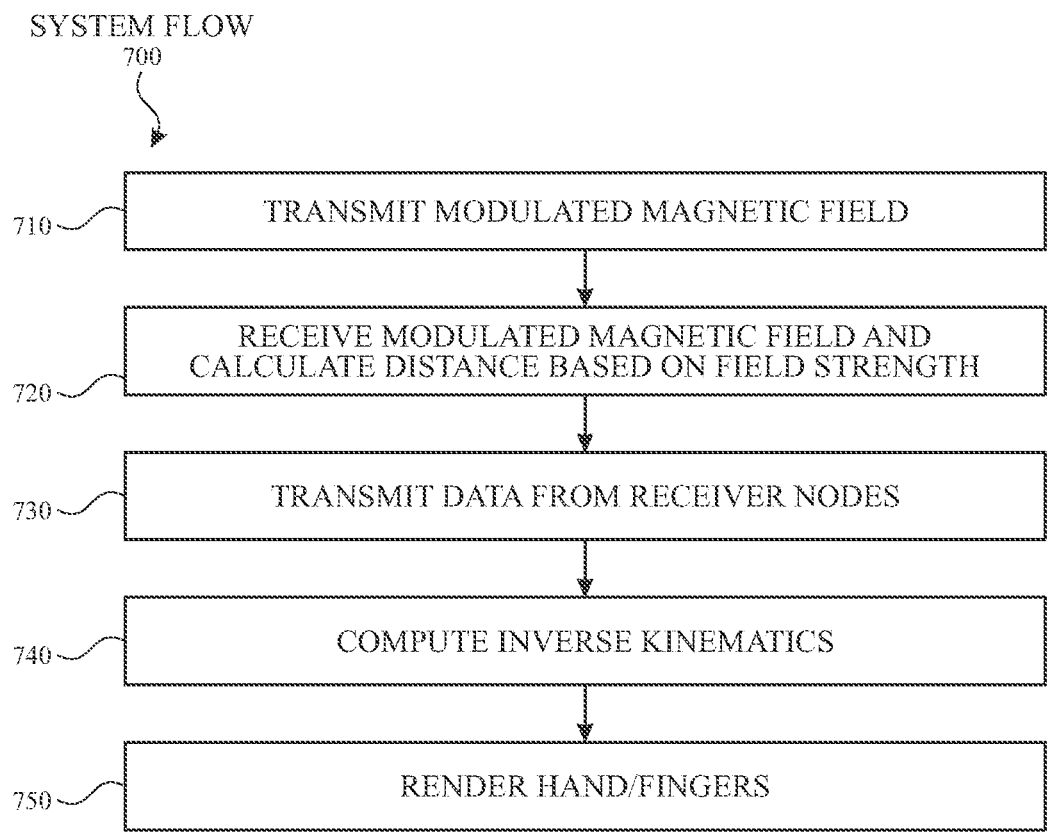
FIG. 5 illustrates an exemplary process for determining the locations, angles and motions of the hand and fingers and their respective bones using a device with fingertip nodes or magnetic sensors on the hands according to examples of the disclosure.

FIG. 5 illustrates an exemplary process 700 for determining the locations, angles and motions of the hand and fingers and their respective bones using a device with fingertip nodes and/or magnetic sensors on the hands according to examples of the disclosure. In some examples, at step 710, the electromagnetic coil (spiral, solenoid, or circular) can generate a modulated magnetic field B(t). In some examples, a single modulated magnetic field can be transmitted from a location on the user's body such as a neck-worn transmitter, a headset, a waistband, or the like. In some examples, a modulated magnetic field can be transmitted from one or more coils located on or near the palms/wrists of a user's hands. In some examples, at step 720, the fingertip nodes and/or magnetic sensors (e.g., located on the palms/wrists) can receive the modulated magnetic field and perform demodulation at the modulation frequency of the desired reference transmitter. For example, the finger nodes of the right hand may perform demodulation at a first frequency corresponding to a transmitter located on the right palm/wrist. Similarly, the finger nodes of a left hand may perform demodulation at a second frequency corresponding to a transmitter located on the left palm/wrist. In addition, magnetic sensors for locating the positions of each of the left and right hand (e.g., located on each palm/wrist of the user) may perform demodulation at a third modulation frequency corresponding transmitter on the user's body. In some examples, a single modulation source, e.g., on the user's body, can be used to determine both hand and finger positions using a single modulation frequency. In addition, at step 720, the distance "d" between the fingertip nodes/magnetic sensors and a corresponding transmitting source (e.g., electromagnetic coil) can be determined based on magnetic field amplitude. In some examples, at step 730, the fingertip nodes/magnetic sensors can then transmit data corresponding to the measured distance. In some examples, the data can be transmitted over a low power wireless communication link (e.g., BLE). At step 740, the position information of the fingers and/or hands can be used to computer inverse kinematics to determine the orientation, position, and angle of finger and hand bones. In some examples, at step 740, the inverse kinematics calculation can be performed in a hand controller or other intermediate device, before transmitting to a host controller that generates the environment. In some examples, at step 740, the distance information for the fingers and hands can be transmitted directly to the host, and inverse kinematics can be performed on the host. In some examples, at step 750, the host device can use the orientation, position, and angle of objects (e.g., finger and hand bones) determined by the inverse kinematics at step 740 to then render the hands and the fingers in space with the accurate joint positions in the environment.

Figure 6:
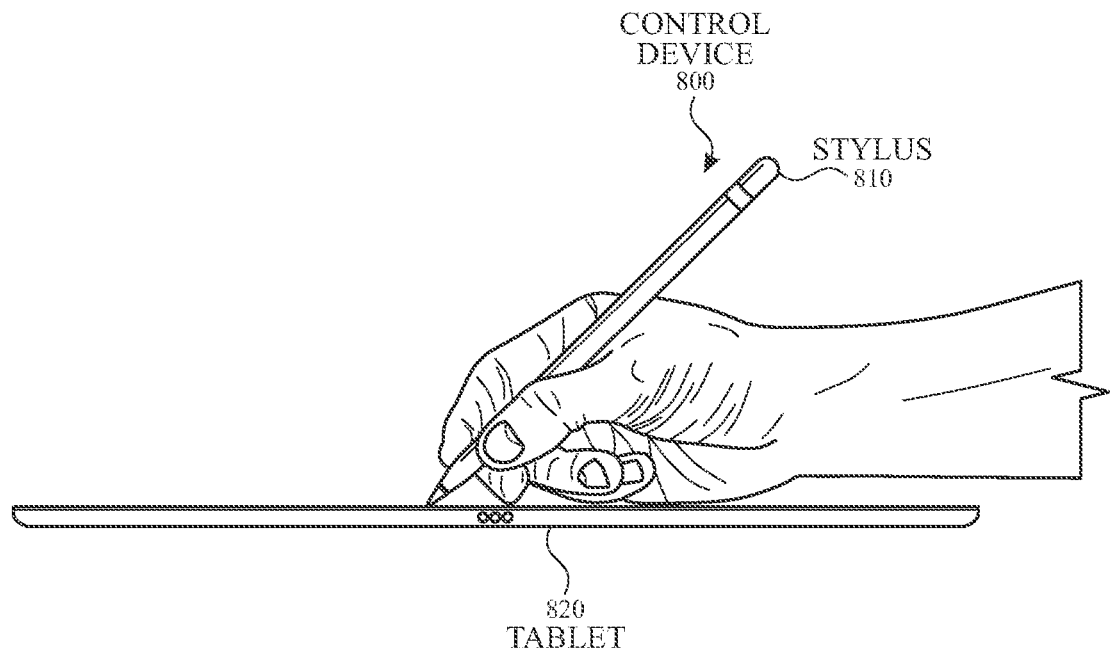
FIG. 6 illustrates an exemplary architecture based on magnetic sensor based proximity sensing in a stylus-tablet system according to examples of the disclosure.

FIG. 6 illustrates an exemplary architecture based on magnetic sensor based proximity sensing in a stylus-tablet system according to examples of the disclosure. In some examples, the magnetic field generator can be located in the tablet 820 and a magnetic sensor can be located in the stylus 810. In some examples, a magnetic field generator can be provided in each corner of the tablet 820, and distances from each of the four corners can be used to determine the position of the stylus 810 relative to the tablet. In some examples, the stylus 810 can include a magnetic sensor based proximity sensor on each end of the stylus, allowing both distance and orientation of the stylus to be detected. In some examples, magnetic sensor based proximity sensing can be used to perform gesture recognition between the tablet and the stylus without requiring the stylus to contact the sensing surface.

Figure 7:
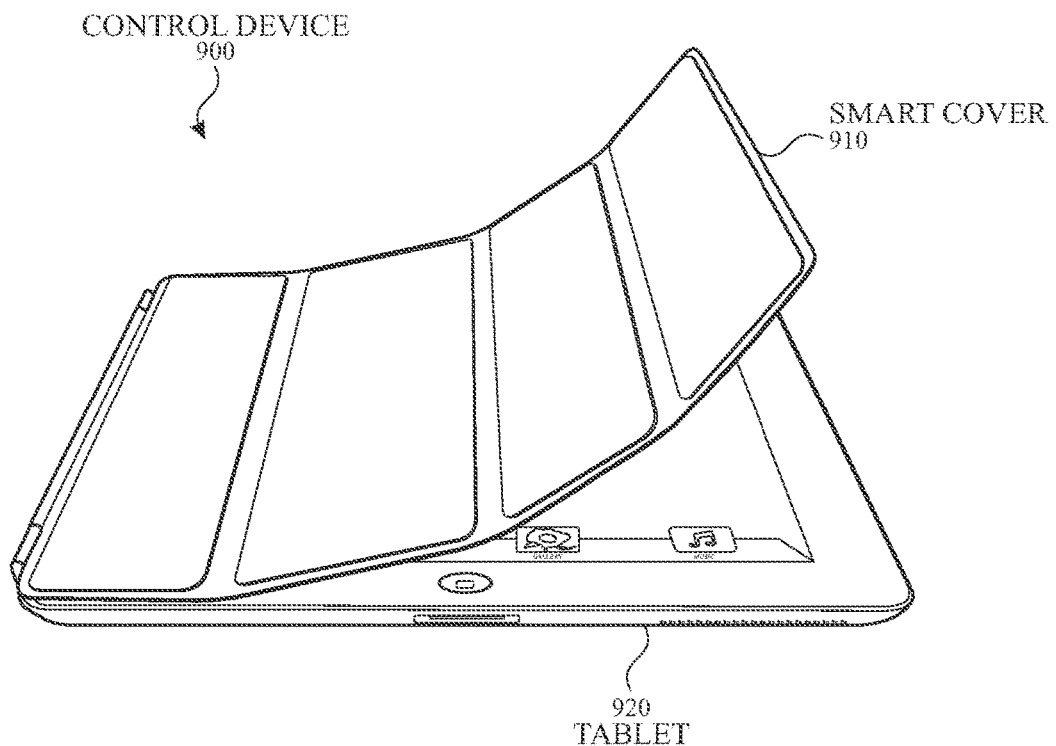
FIG. 7 illustrates an exemplary architecture based on magnetic sensor based proximity sensing in a smart tablet cover system according to examples of the disclosure.

FIG. 7 illustrates an exemplary architecture based on magnetic sensor based proximity sensing in a smart tablet cover system according to examples of the disclosure. In some examples, a magnetic field generator can be located in the tablet 920 and a magnetic sensor can be located in the smart cover 910. In some examples, magnetic sensor based proximity sensing according to examples of the disclosure can be used to determine whether the cover is open, as well as how far the cover is open. Compared to cover based on static magnetic fields for determining whether the cover is open, a system based on magnetic sensor based proximity sensing using modulated magnetic sensor can have improved immunity to the effects of interfering magnetic fields. For example, a smart cover incorporating a modulated magnetic field sensor may not falsely cause a device to turn on or off in the presence of a static magnetic field from a source other than the tablet 920.

Figure 8:
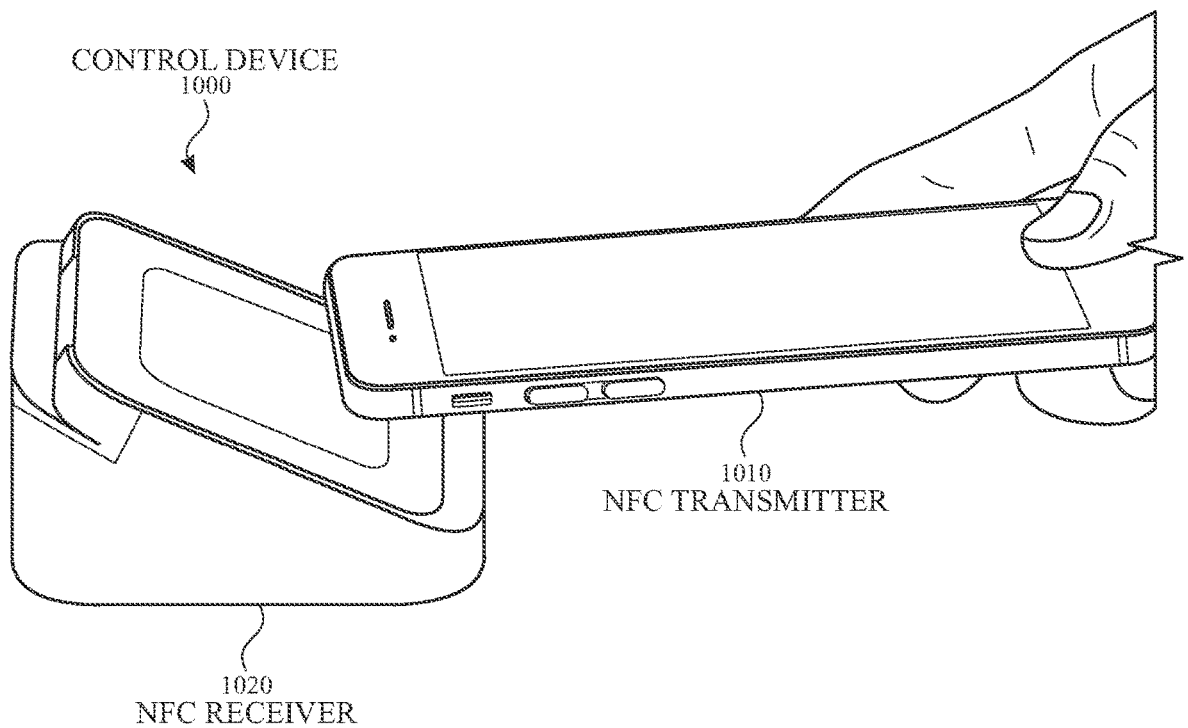
FIG. 8 illustrates an exemplary architecture based on magnetic sensor based proximity sensing in a Near Field Communication system according to examples of the disclosure.
Figure 9:
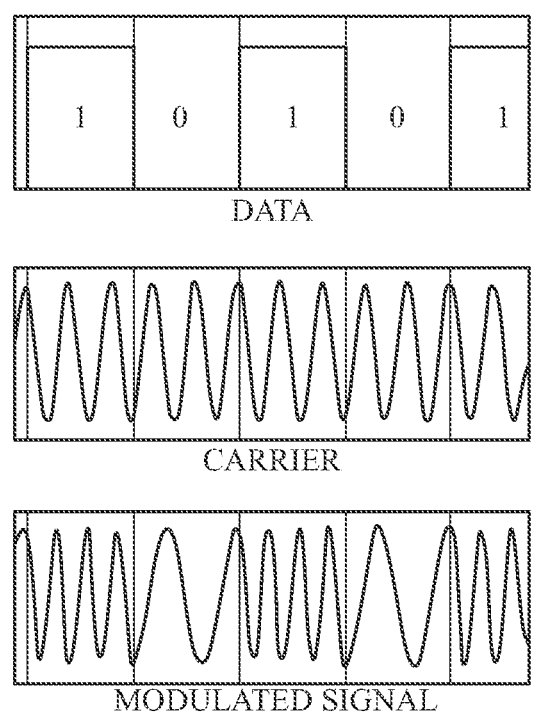
FIG. 9 illustrates an alternative embodiment according to examples of the disclosure.

FIG. 8 illustrates an exemplary architecture based on magnetic sensor sensing of a modulated magnetic field in a Near Field Communication system according to examples of the disclosure. Magnetic sensor based communication sensing can be used to enhance the performance of a Near Field Communication system. Near Field Communication system generally needs precise alignment between the transmitter and the receiver but with the magnetic sensor based sensing, a greater amount of misalignment can be tolerated. While some of the examples of the disclosure relate only to magnetic sensor based proximity sensing, a modulated magnetic field can also be used for communicating data. FIG. 9 below described one exemplary technique for data communication utilizing a modulated magnetic field according to examples of the disclosure.

FIG. 9 illustrates a modulation scheme to allow for data communication using a modulated magnetic field according to examples of the disclosure. In some examples, the modulation source of an exemplary magnetic sensing system (e.g., modulation source 105 above) can be used for data communication. FIG. 9 shows one possible data encoding scheme using frequency shift keying (FSK). As illustrated, a simple implementation can be a binary FSK where one frequency corresponds to 0 and another frequency corresponds to 1. In some examples, multiple communication "symbols" can be used with corresponding frequencies. In some examples, the transmitter and receiver can communicate using a predetermined "alphabet" of frequencies where each "letter" (or symbol) would correspond to a different frequency.

Therefore, according to the above, some examples of the disclosure are directed to control device included in a system and configured to be worn over a hand of a user, the control device comprising: a magnetic field generator for generating one or more modulated electromagnetic fields, a plurality of magnetic sensors, each magnetic sensor proximate to a hand or finger and configured to receive the one or more magnetic fields and demodulate the received one or more modulated electromagnetic fields to produce a plurality of demodulated signals, and a processor configured to determine a position of one or more of the hand and finger of the user using the demodulated signals. Additionally or alternatively to one or more of the examples disclosed above, in some examples, the processor is further configured to determine joint angles of one or more of the hand and finger of the user using the position of one or more of the hand and finger. Additionally or alternatively to one or more of the examples disclosed above, in some examples, the processor is further configured to communicate to a host device using wireless signals, the joint angles of one or more of the hand and finger of the user. Additionally or alternatively to one or more of the examples disclosed above, in some examples, an image of a hand or a finger is rendered by the host device using the joint angles of one or more of the hand and finger of the user. Additionally or alternatively to one or more of the examples disclosed above, in some examples, a single modulated electromagnetic field is generated to determine a position of one or more of the hand and finger of the user. Additionally or alternatively to one or more of the examples disclosed above, in some examples, a first modulated electromagnetic field is generated to determine a position of the right hand, a second modulated electromagnetic field is generated to determine a position of the left hand, a third modulated electromagnetic field is generated to determine a position of all the fingers of the right hand and a fourth modulated electromagnetic field is generated to determine a position of all the fingers of the left hand. Additionally or alternatively to one or more of the examples disclosed above, in some examples, one or more electromagnetic fields, each with a different frequency is generated to determine a position of one or more of the fingers of the user. Additionally or alternatively to one or more of the examples disclosed above, in some examples, an electromagnetic field with a particular frequency is generated to determine a position of a particular finger. Additionally or alternatively to one or more of the examples disclosed above, in some examples, an electromagnetic field with a particular frequency is generated to determine a position of a particular hand. Additionally or alternatively to one or more of the examples disclosed above, in some examples, an electromagnetic field with a first frequency is generated to determine a position of all the fingers of the right hand, an electromagnetic field with a second frequency is generated to determine a position of all the fingers of the left hand and an electromagnetic field with a third frequency is generated to determine a position of the right hand and the left hand. Additionally or alternatively to one or more of the examples disclosed above, in some examples, a plurality of modulated electromagnetic fields are generated to determine a position of one or more of the fingers of the same hand of the user.

Although the disclosed examples have been fully described with reference to the accompanying drawings, it is to be noted that various changes and modifications will become apparent to those skilled in the art. Such changes and modifications are to be understood as being included within the scope of the disclosed examples as defined by the appended claims.

The invention claimed is:

1. A control device included in a system and configured to be worn over a hand of a user, the control device comprising:
   a magnetic field generator for generating one or more modulated electromagnetic fields;
   a plurality of magnetic sensors, each magnetic sensor proximate to a hand or a finger and configured to:
      receive one or more modulated electromagnetic fields, and
      demodulate the received one or more modulated electromagnetic fields to produce a plurality of demodulated signals; and
   a processor configured to determine a position of one or more of: the hand and one or more fingers of the user using the demodulated signals.

2. The control device of claim 1, the processor further configured to determine joint angles of one or more of: the hand and the one or more fingers of the user using the determined position.

3. The control device of claim 1, the processor further configured to communicate to a host device using wireless signals, the wireless signals including information indicative of the determined joint angles.

4. The control device of claim 3, wherein the information is such that the host device is capable of rendering an image of the hand or the one or more fingers using the determined joint angles.

5. The control device of claim 1, wherein the one or more modulated electromagnetic fields is a single modulated electromagnetic field.

6. The control device of claim 1, wherein the one or more modulated electromagnetic fields includes a first modulated electromagnetic field, a second modulated electromagnetic field, a third modulated electromagnetic field, and a fourth modulated electromagnetic field,
   wherein the processor determines:
      the position of a right hand of the user using the first modulated electromagnetic field,
      the position of a left hand of the user using the second modulated electromagnetic field,
      the position of all fingers of the right hand of the user using the third modulated electromagnetic field, and
      the position of all fingers of the left hand of the user using the fourth modulated electromagnetic field.

7. The control device of claim 1, wherein the one or more electromagnetic fields includes different frequencies, and further wherein the determination of the position is a determination of the position of the one or more fingers of the user.

8. The control device of claim 7, wherein each of the different frequencies is unique to the position of the one or more of the fingers of the user.

9. The control device of claim 7, wherein at least one of the different frequencies is used in the determination of the position of the hand.

10. The control device of claim 7, wherein the different frequencies include a first frequency, a second frequency, and a third frequency,
    wherein the processor determines:
       the position of all fingers of a right hand of the user using the first frequency,
       the position of all fingers of a left hand of the user using the second frequency, and
       the position of the right hand and the left hand of the user using the third frequency.

11. The control device of claim 1, wherein the one or more modulated electromagnetic fields is a plurality of modulated electromagnetic fields and wherein the determination of the position is of one or more fingers of a same hand of the user.

12. A method of operating a control device, the method comprising:
    generating one or more modulated electromagnetic fields using a magnetic field generator included in the control device;
    receiving the one or more modulated electromagnetic fields by a plurality of magnetic sensors, each of the plurality of magnetic sensors proximate to a hand or a finger;
    demodulating, using the plurality of magnetic sensors, the received one or more modulated electromagnetic fields to produce a plurality of demodulated signals; and
    determining, using a processor of the control device, a position of one or more of: the hand and one or more fingers of a user using the demodulated signals.

13. The method of claim 12, further comprising:
    determining joint angles of one or more of: the hand and the one or more fingers of the user using the determined position.

14. The method of claim 13, further comprising:
    wirelessly communicating with a device host by sending signals including information indicative of the determined joint angles, wherein the information is such that the host device is capable of rendering an image of the hand or the one or more fingers using the determined joint angles.

15. The method of claim 12, wherein the one or more modulated electromagnetic fields includes a first modulated electromagnetic field, a second modulated electromagnetic field, a third modulated electromagnetic field, and a fourth modulated electromagnetic field, wherein the determination of the position includes:
determining the position of a right hand of the user using the first modulated electromagnetic field,
determining the position of a left hand of the user using the second modulated electromagnetic field,
determining the position of all fingers of the right hand of the user using the third modulated electromagnetic field, and
determining the position of all fingers of the left hand of the user using the fourth modulated electromagnetic field.

16. The method of claim 12, wherein the one or more electromagnetic fields includes different frequencies, and further wherein the determination of the position is a determination of the position of the one or more fingers of the user.

17. The method of claim 16, wherein each of the different frequencies is unique to the position of the one or more of the fingers of the user.

18. The method of claim 16, wherein at least one of the different frequencies is used in the determination of the position of the hand.

19. The method of claim 16, wherein the different frequencies includes a first frequency, a second frequency, and a third frequency, wherein the determination of the position includes:
determining the position of all fingers of a right hand of the user using the first frequency,
determining the position of all fingers of a left hand of the user using the second frequency, and
determining the position of the right hand and the left hand of the user using the third frequency.

20. The method of claim 12, wherein the one or more modulated electromagnetic fields is a plurality of modulated electromagnetic fields and wherein the determination of the position is of one or more fingers of a same hand of the user.

* * * * *